United States Patent [19]

Tsudaka et al.

[11] Patent Number: 5,723,235
[45] Date of Patent: Mar. 3, 1998

[54] METHOD OF PRODUCING PHOTOMASK AND EXPOSING

[75] Inventors: Keisuke Tsudaka; Minoru Sugawara, both of Kanagawa, Japan

[73] Assignee: Sony Corporation, Tokyo, Japan

[21] Appl. No.: 648,665

[22] Filed: May 16, 1996

Related U.S. Application Data

[62] Division of Ser. No. 336,656, Nov. 4, 1994, Pat. No. 5,558,963.

[30] Foreign Application Priority Data

Nov. 8, 1993 [JP] Japan .................................. 6-302339
Mar. 14, 1994 [JP] Japan .................................. 6-069113

[51] Int. Cl.$^6$ ............................................. G03F 9/00
[52] U.S. Cl. ......................................... 430/5; 430/394
[58] Field of Search ............................ 430/5, 22, 311, 430/312, 315, 394

[56] References Cited

U.S. PATENT DOCUMENTS 5,316,896  5/1994  Fukuda et al. ................. 430/322

FOREIGN PATENT DOCUMENTS 0 313 013 A2  4/1989  European Pat. Off. .

OTHER PUBLICATIONS

Bachvan Huynh, et al., "Optical Printability of Defects in Two-Dimensional Patterns", *J.Vac.Sci.Technol.*, vol. B6, No. 6, Nov./Dec. 1988, pp. 2207–2212.

Kazuya Kadota, et al., "Analysis for Effects of Mask Defects to Resist Pattern Using a Three-Dimensional Photolithography Simulator", *J.Vac.Sci.Technol.*, vol. B8, No. 5, Sep./Oct. 1990, pp. 1080–1086.

*Primary Examiner*—S. Rosasco
*Attorney, Agent, or Firm*—Hill, Steadman & Simpson

[57]  ABSTRACT

A photomask, a method of producing the same, a method of exposing using the same and a method of manufacturing a semiconductor device using the same are disclosed, which permit correlation to be found out with respect to a large number of mask condition parameters, thus permitting optimum condition to be obtained such as to be less aloof from the actual process, permits quantitative grasping of performance, permits reduction of time and cost, and permits effects of mask pattern size fluctuations, etc. into considerations.

Either defocus latitude, mask pattern size latitude II and exposure latitude I is combined with pluralities of data in predetermined ranges of the other two latitudes I and II to determine the permissible range of the first-noted latitude III for optimum value determination.

12 Claims, 3 Drawing Sheets

METHOD OF PRODUCING PHOTOMASK AND EXPOSING

This is a division of application Ser. No. 08/336,656, filed Nov. 4, 1994 now U.S. Pat No. 5,558,962.

BACKGROUND OF THE INVENTION

1. Field of the Invention

This invention relates to a photomask, a method of producing the same, a method of exposing using the same and a method of manufacturing semiconductor devices using the same. The invention can be utilized for photomasks used for forming various pattern images, a method of producing such photomasks, a method of exposing using such photomasks and a method of manufacturing semiconductor devices using such photomasks. For example, it can be utilized for photomasks used for the techniques of forming various patterns in semiconductor device manufacture processes, a method of producing such photomasks and a method of exposing using such photomasks. Further, it can be applied to an exposing apparatus and also to a method of semiconductor device manufacture, for instance a method of manufacturing such semiconductor devices as memory devices, logic operational devices, CCD devices, LCD devices, etc.

2. Description of the Related Art

The related art will now be described by taking the field of semiconductor devices as an example. When manufacturing a semiconductor device, various patterns are formed. In such semiconductor device manufacture, a pattern transfer process or commonly termed lithographic process is used mainly for transferring a photomask pattern on a resist material on a semiconductor wafer.

With a recent trend for finer semiconductor device structures, it is becoming more and more difficult to obtain a fine pattern with a desired resolution. As an example, the prior art photomask has a problem that the resist pattern size obtained by transfer is not in accord with a fine mask pattern size and is smaller than a desired value. Accordingly, in the prior art the mask pattern size is set to be greater than the resist pattern size that is obtainable by the transfer. Further, to solve the above problem and for the purpose of resolution improvement, investigations have been conducted about making shorter the wavelength of light of exposing in exposure apparatus used in the lithographic process, phase shifting masks for shifting the light phase, a shape change illumination process, in which the shape of a light source is changed, a pupil filter process, in which a filter is provided in an emission pupil in condenser lens system, and a FLEX process, in which exposing is done a plurality of times at different focus positions.

A general example of the prior art method will now be given. FIG. 1 is a graph illustrating the concept under-lying the prior art method example. In this method, the transfer resist pattern size is determined by experiments or simulation with a plurality of different defocus values, thus obtaining a mask pattern size versus defocus curve 1. From this curve 1, the range of mask pattern size in a design tolerance range 2 is obtained. From this mask pattern size range depth of focus 3 is obtained, the numerical value of which indicates the performance of the lithography.

Further, there is a ED tree method which correlatively deals with the depth of focus and the exposure dose latitude. An example of this method is shown in FIG. 2. Curves 41 to 46 as shown, represent the relation between the exposure dose and the defocus for respective percentage changes in the transfer resist pattern size from the design mask pattern size. Assuming a design tolerance condition of the transfer resist pattern size that the percentage change therein from the design value is within ±10% (see curves 43 and 44 in FIG. 2) and that the exposure dose latitude that is necessary is 20% in range as shown by 5 in FIG. 2, the depth of focus is as shown by 3 in the Figure.

In simulation evaluation in various prior art techniques, the parameters that are evaluated are at most two in number. In cases where three or more parameters are evaluated, one of these parameters is fixed to a particular value, and only the relationship among the remaining two or more parameters is obtained. It is impossible to optimize three or more parameters under mutual correlation thereof.

In the prior art method of evaluation as exemplified above, no considerations are given to the fluctuations of the exposure dose and also the fluctuations of the mask pattern size of the mask. Therefore, the depth of focus that is obtainable is greatly aloof from the actual process condition, and it is greater than the actual depth of focus. Besides, in this method it is impossible to obtain quantitative evaluation of other parameters such as the exposure dose latitude and the mask pattern size latitude.

In the ED tree method (FIG. 2), again no considerations are given to the fluctuations of the mask pattern size on the mask. In this case, there is a fatal drawback that it is impossible to obtain the mask pattern size latitude in addition to the serious drawback that the calculated depth of focus is extremely aloof from the actual process condition.

In the prior art method, the evaluation by simulation required an enormous amount of experiments for making up for the great aloofness from the actual process condition. The experiment requires time and cost, and in this case it is difficult to obtain efficient and systematic evaluation. Particularly, in the distal device development without established apparatus or material, there is a serious drawback that it is very difficult to find out the relationship among various techniques.

Further, as patterns are finer, a serious problem is posed by adverse effects of mask pattern size fluctuations on the transfer pattern, which has previously been any problem. In the prior art, it has been impossible to carry out evaluation by taking the mask pattern size fluctuations into consideration. Giving no consideration to the mask pattern size fluctuations means that the evaluation has heretofore been made under the assumption that the mask pattern size of the mask is in accord with the design mask pattern size and is fixed at all times. Actually, however, there are fluctuations in the mask production process, and it is impossible to perfectly eliminate the mask pattern size fluctuations. Hence, it has been indispensable for proper condition setting to let the mask pattern size fluctuations be reflected on the evaluation, but this has heretofore been impossible.

OBJECT AND SUMMARY OF THE INVENTION

An object of the invention is to provide a photomask, a method of producing the same, a method of exposing using the same and a method of manufacturing a semiconductor device using the same, which can solve the problems discussed above in the prior art, permit mutual correlation of a large number of parameters, for instance three or more parameters, to be found out, permit optimum condition to be obtained from such correlation, permit reduction of aloofness from the actual process condition, permit quantitatively grasping various performances, permit reduction of time and cost, permit taking the influence of mask pattern size fluctuations into consideration and permit actual optimization.
}

To attain the above object of the invention, there is provided a photomask used for the photolithographic process and having a transmitting area and a blocking area, which photomask is obtained by setting combinations of pluralities of defocus and mask pattern size values in predetermined ranges of the defocus latitude and the mask pattern size latitude, obtaining transfer patterns by varying the exposure dose, and checking whether the transfer patterns meet a design tolerance condition, thereby obtaining the exposure dose latitude as the range of exposure dose meeting the tolerance condition in all the predetermined ranges of the defocus latitude and the mask pattern size latitude.

According to the invention, when obtaining the exposure dose latitude, combinations of plurality of defocus and mask pattern size values in predetermined ranges of the defocus latitude and the mask pattern size latitude are set. The combinations are suitably as finely set as possible in the predetermined ranges of the defocus latitude and the mask pattern size latitude. On the basis of and for each of these combinations, transfer patterns are obtained by varying the exposure dose. The transfer patterns for the various exposure doses may be obtained by a calculation operation using simulation or the like, by actual measurement in experiments or by combining both these means. Suitably, the operation is carried out in the mode of obtaining transfer resist patterns in the photolithography. The transfer patterns which are obtainable by the above various means are checked as to whether they meet the design tolerance condition. For example, a check is made as to whether the size, area, shape, etc. of the patterns meets the tolerance condition at the time of the design (i.e., at the time of semiconductor device design in case of a mask for the semiconductor device formation). According to this check is obtained the exposure dose latitude as the range of exposure dose meeting the tolerance condition in all the predetermined ranges of the defocus latitude and the mask pattern size latitude. At least one of mask parameters is set such as to maximize the exposure dose latitude. The mask parameter may be the shape and size of the design pattern, the transmissivity and phase of the transmitting area, the transmissivity and phase of the light shielding area, etc.

The above object of the invention is also attained by a photomask, in which the transmitting area has two portions for transmitting light at mutually different phases.

The photomask with the transmitting area thereof having two portions for transmitting light at mutually different phases is a commonly called phase shift mask. In this case, it is possible to increase the resolution by setting the phase difference most suitably to 180°. It is possible to provide other phase differences depending on the design.

The phase difference may be provided by forming a phase shift section or a commonly called shifter section by changing the thickness of a portion of a light transmissive substrate, of glass for instance, by engraving that portion. Alternatively, it may be provided by forming a phase shift section or commonly called shifter section with a film of a phase shift material (a resist, $SiO_2$, etc.) such that the thickness of the film provides a phase difference of 180°, for instance. Further, a portion for providing for a phase difference may be formed by changing the optical path length by changing the refractive index with doping. Various further means may also be used to this end.

The above object of the invention is further attained by a photomask with the light shielding area thereof transmitting light in such an extent as not to sensitize a sensitizer exposed in the photolithographic process and also transmitting light at a different phase from that of the transmitting area.

The above object of the invention is further attained by a photomask, in which the mask parameter is one member or a combination of two or more members of the group consisting of the mask pattern size, the phase of the transmitting area, the transmissivity of the light shielding area and the phase of the light shielding area.

The above object of the invention is further attained by a method of producing a photomask having a transmitting area and a light shielding area, which comprises the steps of setting combinations of pluralities of defocus and mask pattern size values in predetermined ranges of the focus latitude and the mask pattern size latitude, obtaining transfer patterns by varying the exposure dose, and checking whether the transfer patterns meet a design tolerance condition, thereby obtaining the exposure dose latitude as the range of exposure dose meeting the tolerance condition in all the predetermined ranges of the focus latitude and the mask pattern size latitude, a mask parameter being set for maximizing the obtained exposure dose latitude.

According to the invention, when obtaining the exposure dose latitude, combinations of pluralities of defocus and mask pattern size values in predetermined ranges of the focus latitude and the mask pattern size latitude are set. The combinations are suitably as finely set as possible in the predetermined ranges of the focus latitude and the mask pattern size latitude. On the basis of and for each of these combinations, transfer patterns are obtained by varying the exposure dose. The transfer patterns for the various exposure doses may be obtained by a calculation operation using simulation or the like, by actual measurement in experiments or by combining both these means.

The transfer patterns obtained as above are typically transfer resist patterns in the photolithography, and the operation is suitably carried out in the mode of obtaining transfer resist patterns in the photolithography. The transfer patterns which are obtainable by the above various means are checked as to whether they meet the design tolerance condition. For example, a check is made as to whether the size, area, shape, etc. of the patterns meets the tolerance condition at the time of the design (i.e., at the time of the semiconductor device design in case of a mask for the semiconductor device formation). According to this check is obtained the exposure dose latitude as the range of exposure dose meeting the tolerance condition in all the predetermined ranges of the defocus latitude and the mask pattern size latitude. At least one of mask parameters is set such as to maximize the exposure dose latitude. The mask parameter may be the shape and size of the design pattern, the transmissivity and phase of the transmitting area, the transmissivity and phase of the light shielding area, etc.

In the above way, it is possible to obtain the condition for optimizing the mask design, thus permitting production of the optimum mask.

When obtaining the mask design optimization condition, it is possible to simultaneously set the optimizing condition for the exposing condition.

The above object of the invention is further attained by a method of exposing using a photomask having a transmitting area and a light shielding area, which comprises the steps of setting combinations of pluralities of defocus and mask pattern size values in predetermined ranges of the defocus latitude and the mask pattern size latitude, obtaining a transfer pattern by varying the exposure dose, and checking whether the transfer pattern meets a design tolerance condition, thereby obtaining the exposure dose latitude as the range of exposure dose meeting the tolerance condition in all the predetermined ranges of the defocus latitude and the size latitude, the exposure being set for maximizing the obtained exposure dose latitude. Such exposure parameter may be lens numerical aperture (NA), partial coherency, exposure wavelength, light source shape, pupil filter structure, etc.

The above object of the invention is further attained by a method of exposing with a photomask having a transmitting area and a light shielding area, which comprises the steps of setting combinations of pluralities of defocus and mask pattern size values in predetermined ranges of the defocus latitude and the mask pattern size latitude, obtaining transfer patterns by varying the exposure dose, and checking whether the transfer patterns meet a design tolerance condition, thereby obtaining the exposure dose latitude as the range of exposure dose meeting the tolerance condition in all the predetermined ranges of the defocus latitude and the mask pattern size latitude, a mask parameter being set for maximizing the obtained exposure dose latitude.

According to the invention, the optimum condition of the photomask can be set with means which can be adopted according to the invention.

The above object of the invention is further attained by a method of exposing, in which when optimizing the photomask design condition for obtaining the exposure dose latitude according to the predetermined defocus latitude and mask pattern size latitude, the condition of exposing using the photomask optimized simultaneously, thereby obtaining the optimum exposing condition.

According to the invention, the optimum condition of exposing is advantageously determined like the setting of the optimum condition of the mask formation.

The above object of the invention is further attained by a method of manufacturing a semiconductor device in photolithography using a photomask having a transmitting area and a blocking area, the photomask being obtained by setting combinations of pluralities of defocus and mask pattern size values in predetermined ranges of the defocus latitude and the mask pattern size latitude, obtaining transfer patterns by varying the exposure dose, and checking whether the transfer patterns meet a design tolerance condition, thereby obtaining the exposure dose latitude as the range of exposure dose meeting the tolerance condition in all the predetermined ranges of the defocus latitude and the mask pattern size latitude.

The semiconductor device may suitably be finely integrated LSIs, for instance logic devices, CCD devices, LCD devices, memory devices, etc.

The above object of the invention is further attained by a photomask having a transmitting area and a blocking area, which is obtained by setting combinations of pluralities of exposure dose and mask pattern size values in predetermined ranges of the exposure dose latitude and the mask pattern size latitude, obtaining transfer patterns by varying the defocus in the neighborhood of the just focus, and checking whether the transfer patterns meet a design tolerance condition, thereby obtaining the exposure dose latitude as the range of exposure dose meeting the tolerance condition in all the predetermined ranges of the defocus latitude and the mask pattern size latitude, a mask parameter being set for maximizing the obtained exposure dose latitude.

According to the invention, when obtaining the defocus latitude, combinations of pluralities of exposure dose and mask pattern size values in predetermined ranges of the exposure dose latitude and the mask pattern size latitude are set. The combinations are suitably as finely set as possible in the predetermined ranges of the exposure dose latitude and the mask pattern size latitude. On the basis of and for each of these combinations, transfer patterns are obtained by varying the defocus in the neighborhood of the just focus. (In the specification, by the term "just focus" is meant a focus position of the greatest light intensity distribution and contrast.) The transfer patterns for the various defocuses may be obtained by a calculation operation using simulation or the like, by actual measurement in experiments or by combining both these means. Suitably, the operation is carried out in the mode of obtaining transfer resist patterns in the photolithography. The transfer patterns which are obtained by the above various means are checked as to whether they meet the design tolerance condition. For example, a check is made as to whether the size, area, shape, etc. of the patterns meets the tolerance condition at the time of the design (i.e., at the time of semiconductor device design in case of a mask for the semiconductor device formation). According to this check is obtained the defocus latitude as the range of defocus meeting the tolerance condition in all the predetermined ranges of the exposure dose latitude and the mask pattern size latitude. At least one of mask parameters is set such as to maximize the defocus latitude. The mask parameter may be the shape and size of the design pattern, the transmitting and phase of the transmitting area, and transmissivity and phase of the light shielding area, etc.

The above object of the invention is further attained by a photomask with the transmitting area thereof having two portions for transmitting light at mutually different phases.

As for the phase difference, it is most suitably set to 180° for resolution increase. It is possible to provide other phase differences as well depending on the design.

The phase difference may be provided by forming a phase shift section or a commonly called shifter section by changing the thickness of a portion of a light transmissive substrate, of glass; for instance, by engraving that portion. Alternatively, it may be provided by forming a phase shift section or commonly called shifter section with a film of a phase shift material (a resist, $SiO_2$, etc.) such that the thickness of the film provides a phase difference of 180°, for instance. Further, a portion for providing for a phase difference may be formed by changing the optical path length by changing the refractivity with doping. Various further means may also be used to this end.

The above object of the invention is further attained by a photomask with the light shielding area thereof transmitting light in such an extent as not to sensitize a sensitizer in the photolithographic process and also transmitting light at a different phase from that of the transmitting area.

The above object of the invention is further attained by a photomask, in which the mask parameter is one member or a combination of two or more members of the group consisting of the mask pattern size, the phase of the transmitting area, the transmissivity of the light shielding area and the phase of the light shielding area.

The above object of the invention is further attained by a method of producing a photomask having a transmitting area and a light shielding area, which comprises the steps of setting combinations of pluralities of exposure dose and mask pattern size values in predetermined ranges of the exposure dose latitude and the mask pattern size latitude, obtaining transfer patterns by varying the defocus in the neighborhood of the just focus, and checking whether the transfer patterns meet a design tolerance condition, thereby obtaining the defocus latitude as the range of defocus meeting the tolerance condition in all the predetermined ranges of the exposure dose latitude and the mask pattern size latitude, a mask parameter set for maximizing the obtained defocus latitude.

According to the invention, when obtaining the defocus latitude, combination of pluralities of exposure dose and mask pattern size values in predetermined ranges of the exposure dose latitude and the mask pattern size latitude are set. The combination are suitably as finely set as possible in the predetermined ranges of the exposure dose latitude and the mask pattern size latitude. On the basis of and for each of these combinations, transfer patterns are obtained by varying the defocus in the neighborhood of the just focus. The transfer patterns for the various defocuses may be obtained by a calculation operation using simulation or the like, by actual measurement in experiments or by combining both these means.

The transfer patterns that are obtained are typically transfer resist patterns in photolithography, and suitably the operation is carried out in the mode of obtaining transfer resist patterns in the photolithography. The transfer patterns which are obtained by the above various means are checked as to whether they meet the design tolerance condition. For example, a check is made as to whether the size, area, shape, etc. of the pattern meets the tolerance condition at the time of the design (i.e., at the time of semiconductor device design in case of a mask for the semiconductor device formation). According to this check is obtained the defocus latitude as the range of defocus meeting the tolerance condition in all the predetermined ranges of the exposure dose latitude and the mask pattern size latitude. At least one of the mask parameters is set such as to maximize the defocus latitude. The mask parameters may be the shape and size of the design pattern, the transmissivity and phase of the transmitting area, the transmissivity and phase of the light shielding area, etc.

In the above way, the mask design optimizing condition is obtained, thus permitting the manufacture of the optimum mask.

When obtaining the mask design optimization condition, the optimization condition for the exposing condition can be obtained simultaneously.

The above object of the invention is further attained by a method of exposing in a photolithographic process, which comprises the steps of setting combinations of pluralities of exposure dose and mask pattern size values in all predetermined ranges of the exposure dose latitude and the the mask pattern size latitude, obtaining transfer patterns by varying the defocus, and checking whether the transfer patterns meet a design tolerance condition, thereby obtaining the defocus latitude as the range of defocus meeting the tolerance condition in all the predetermined ranges of the exposure dose latitude and the mask pattern size latitude, an exposure parameter being set for maximizing the defocus latitude. The exposure parameter may be lens numerical aperture (NA), partial coherency, exposure wavelength, light source shape, pupil filter shape, etc.

The above object of the invention is further attained by a method of exposing using a photomask having a transmitting area and a light shielding area, which comprises the steps of setting combinations of pluralities of exposure dose and mask pattern size values in predetermined ranges of the exposure dose latitude and the mask pattern size latitude, obtaining transfer patterns by varying the defocus in the neighborhood of the just focus, checking whether the transfer patterns meet a design tolerance condition, and thereby obtaining the defocus latitude as the range of defocus meeting the tolerance condition in all the predetermined ranges of the exposure dose latitude and the mask pattern size latitude, a mask parameter being set for maximizing the obtained defocus latitude.

According to the invention, the optimum condition of the photomask can be set by means described above.

The above object of the invention is further attained by a method of exposing, in which when optimizing the photomask design condition for obtaining the defocus latitude according to the predetermined exposure dose latitude and the mask pattern size latitude, the condition of exposing using the photomask is optimized simultaneously to obtain the optimum exposing condition.

According to the invention, the optimum condition of exposing can be advantageously determined in a similar way to the setting of the optimum condition of the mask formation.

The above object of the invention is further attained by a method of manufacturing a semiconductor device in photolithography using a photomask having a transmitting area and a light shielding area, which comprises the steps of setting combinations of pluralities of exposure dose and mask pattern size values in predetermined ranges of the exposure dose latitude and the mask pattern size latitude, obtaining transfer patterns by varying the defocus in the neighborhood of the just focus, and checking whether the transfer patterns meet a design tolerance condition, thereby obtaining the defocus latitude as the range of defocus meeting the tolerance condition in all the predetermined ranges of the exposure dose latitude and the mask pattern size latitude, a mask parameter being set for maximizing the defocus latitude.

The semiconductor device may suitably be finely integrated LSIs, for instance logic circuits, CCDs, LCDs, memory devices, etc.

The above object of the invention is further attained by a photomask having a transmitting area and a light shielding area, which is obtained by setting combinations of pluralities of exposure dose and defocus values in predetermined ranges of the exposure dose latitude and the defocus latitude, obtaining transfer patterns by varying the mask pattern size, and checking whether the transfer patterns meet a design tolerance condition, thereby obtaining the mask pattern size as the range of mask pattern size meeting the tolerance condition in all the predetermined ranges of the exposure dose latitude and the defocus latitude, a mask parameter being set for maximizing the mask pattern size latitude.

According to the invention, when obtaining the mask pattern size latitude, combinations of pluralities of exposure dose and defocus values in predetermined ranges of the exposure dose latitude and the defocus latitude are set. The combinations are suitably as finely set as possible in the predetermined ranges of the exposure dose latitude and the defocus latitude. On the basis of and for each of these combinations, transfer patterns are obtained by varying the mask pattern size in the neighborhood of a predetermined mask pattern size. The transfer patterns for the various mask pattern sizes may be obtained by a calculation operation using simulation or the like, by actual measurement in experiments or by combining both these means. Suitably, the operation is carried out in the mode of obtaining transfer resist patterns in the photolithography. The transfer patterns which are obtainable by the above various means are checked as to whether they meet the design tolerance condition. For example, a check is made as to whether the size, area, shape, etc. of the patterns meet the tolerance condition at the time of the design (i.e., at the time of semiconductor device design in case of a mask for the semiconductor device formation). According to the check is obtained the mask pattern size latitude as the range of mask pattern size meeting the tolerance condition in all the predetermined ranges of the exposure dose latitude and the defocus latitude. At least one of mask parameters is set such as to maximize the mask pattern size latitude. The mask parameter may be the shape and size of the design pattern, the transmissivity and phase of the transmitting area, the transmissivity and phase of the light shielding area, etc.

The above object of the invention is further attained by a photomask with the transmitting area thereof having two portions for transmitting light at mutually different phases.

The phase difference is most suitably 180° for obtaining an increased resolution. It is possible to provide other phase differences as well depending on the design.

The phase difference may be provided by forming a phase shift section or a commonly called shifter section by changing the thickness of a portion of a light transmissive substrate, of glass for instance, by engraving that portion. Alternatively, it may be provided by forming a phase shift section or commonly called shifter section with a film of a phase shift material (a resist, $SiO_2$, etc.) such that the thickness of the film provides a phase difference of 180°, for instance. Further, a portion providing for a phase difference may be formed by changing the optical path length by changing the refractivity with doping. Various further means may also be used to this end.

The above object of the invention is further attained by a photomask with the light shielding area thereof transmitting light in such an extent as not to sensitize a sensitizer exposed in the photographic process and also transmitting light at a different phase from that of the transmitting area.

The above object of the invention is further attained by a photomask, in which the mask parameter is one member or a combination of two or more members of the group consisting of the mask pattern size, the phase of the transmitting area, the transmissivity of the light shielding area and the phase of the light shielding area.

The above object of the invention is further attained by a method of producing a photomask having a transmitting area and a light shielding area, which comprises the steps of setting combinations of pluralities of exposure dose and defocus values in predetermined ranges of the exposure dose latitude and the defocus redundancy, obtaining transfer patterns by varying the mask pattern size latitude, and checking whether the transfer patterns meet a design tolerance condition, thereby obtaining the mask pattern size latitude as the range of mask pattern size meeting the tolerance condition in all the predetermined ranges of the exposure dose latitude and the defocus latitude, a mask parameter being set for maximizing the mask pattern size latitude.

According to the invention, when obtaining the mask pattern size latitude, combinations of pluralities of exposure dose and defocus values in predetermined ranges of the exposure dose latitude and the defocus latitude are set. The combinations are suitably as finely set as possible in the predetermined ranges of the exposure dose latitude and the defocus latitude. On the basis of and for each of these combinations, transfer patterns are obtained by varying the mask pattern size. The transfer patterns for various defocuses may be obtained by a calculating operation using simulation or the like, by actual measurement in experiments or by combining both these means.

The transfer patterns are typically transfer resist patterns in photolithography, and the operation is suitably carried out in the mode of obtaining transfer resist patterns in the photolithography. The transfer patterns which can be obtained by the above various means are checked as to whether they meet the design tolerance condition. For example, a check is made as to whether the size, area, shape, etc. of the patterns meets the tolerance condition at the time of the design (i.e., at the time of semiconductor device design in case of a mask for the semiconductor device formation). According to this check is obtained the mask pattern size latitude as the range of mask pattern size meeting the tolerance condition in all the predetermined ranges of the exposure dose latitude and the mask pattern size latitude. At least one of mask parameters is set such as to maximize the mask pattern size latitude. The mask parameter may be the shape and size of the design pattern, the transmissivity and shape of the transmitting area, the transmissivity and phase of the light shielding area, etc.

In the above way, the mask design optimization condition is obtainable for producing an optimum mask.

When obtaining the mask design optimization condition, the optimization condition of the exposing condition can be obtained simultaneously.

The above object of the invention is further attained by a method of exposing in a photographic process, which comprises the steps of setting combinations of pluralities of exposure dose and defocus values in predetermined ranges of the exposure dose latitude and the defocus latitude, obtaining transfer patterns by varying the mask pattern size, and checking whether the transfer patterns meet a design tolerance condition, thereby obtaining the mask pattern size latitude as the range of mask pattern size meeting the tolerance condition in all the predetermined ranges of the exposure dose latitude and the defocus latitude, an exposure parameter being set for maximizing the mask pattern size latitude.

The above object of the invention is further attained by a method of exposing using a photomask having a transmitting area and a light shielding area, which comprises the steps of setting combinations of pluralities of exposure dose and defocus values in predetermined ranges of the exposure dose latitude and the defocus latitude, obtaining transfer patterns by varying the mask pattern size, and checking whether the transfer patterns meet a design tolerance condition, thereby obtaining the mask pattern size latitude as the range of mask pattern size meeting the tolerance condition in all the predetermined ranges of the exposure dose redundancy and the defocus latitude, a mask parameter being set for maximizing the mask pattern size latitude.

According to the invention, the optimum condition of the photomask can be set by the means described above.

The above object of the invention is further attained by a method of exposing using a photomask having a transmitting area and a light shielding area, in which when optimizing the photomask design condition for obtaining the mask pattern size latitude according to the predetermined defocus latitude and exposure dose latitude, the condition of exposing using the photomask is optimized simultaneously to obtain the optimum exposing condition.

According to the invention, the optimum condition of exposing when using the mask can be advantageously determined in a manner similar to that of setting the optimum condition of the mask formation.

The above object of the invention is further attained by a method of manufacturing a semiconductor device in photolithography using a photomask having a transmitting area and a light shielding area, which comprises the steps of setting combinations of pluralities of exposure dose and defocus values in predetermined ranges of the exposure dose latitude and the defocus latitude, obtaining transfer patterns by varying the mask pattern size, and checking whether the transfer patterns meet a design tolerance condition, thereby obtaining the mask pattern size latitude as the range of mask pattern sizes meeting the tolerance condition in all the predetermined ranges of the exposure dose latitude and the defocus latitude, a mask parameter being set for maximizing the mask pattern size latitude.

The semiconductor device may be finely integrated LSIs, for instance logic circuits, CCDs, LCDs, memory devices, etc.

The constitution of the invention will now be described with reference to FIG. 3. Referring to the Figure, when obtaining the defocus latitude, combinations of pluralities of exposure dose and mask pattern size values in predetermined ranges of the exposure dose latitude (target exposure dose latitude I) and the mask pattern size latitude (mask line width latitude II as target transfer pattern size) are set. The combinations are suitably as finely set as possible in the predetermined ranges of the exposure dose latitude I and the mask pattern size latitude II. Further, on the basis of and for each of these combinations, transfer patterns are obtained by varying the defocus in the neighborhood of the just focus. The transfer patterns are obtained by simulation, by experiments or by combining both these means. In consequence, it can be known that the transfer pattern that is obtained at each point meets or does not meet a resolution condition. The boundary R between the zone, in which the resolution condition is met, and the zone otherwise, can be obtained by taking a plurality of (as many as possible) points. In FIG. 3, the resolution condition is met in the zone under the boundary R. On the basis of this, the depth of focus DOF III on the R surface is obtained, and from this value the defocus latitude is obtained.

On this basis, a mask parameter is set for maximizing the defocus latitude.

In the photomask according to the invention, its optimum value is determined by combining either defocus latitude, mask pattern size latitude or exposure dose latitude with pluralities of data in predetermined ranges of the other two and obtaining the permissible range of the combinations. It is thus possible to obtain the optimum photomask.

In the method of photomask manufacture according to the invention, the optimum value of the photomask is determined by combining either defocus latitude, mask pattern size latitude or exposure dose latitude with pluralities of data in predetermined ranges of the other two and obtaining the premissible range of the combinations. It is thus possible to obtain the optimum condition for the mask formation.

In the method of exposing according to the invention, the photomask which is formed under the above optimum condition is used. Thus, the photomask can be used for satisfactory pattern formation. Further, it is possible to make exposing under the optimized proper exposing condition.

In the method of manufacturing a semiconductor device according to the invention, the photomask which is formed under the above optimum condition is used. Thus, it is possible to obtain a semiconductor device having satisfactory performance, and the method of suited for finer integration.

DETAILED DESCRIPTION OF THE PREFERRED EMBODIMENTS

Now, embodiments of the invention will be described in detail with reference to the drawings without any sense of limiting the invention.

In the transfer pattern shape formation by exposing on a resist material formed on a material to De exposed, for instance a semiconductor wafer, what is used for reduction projection may be referred to as reticle, and what is used for unity magnification projection may be referred to as mask. Also, what corresponds to a master plate may be called mask, and what is obtained by duplicating such a master plate may be called mask. In the specification, the reticles and masks having the above various meanings are collectively referred to as mask.

A first embodiment of the invention will now be described in detail.,

This embodiment is an example of application of the invention to an attenuated phase-shifting mask under exposing conditions of exposure wavelength of 248 nm, NA of 0.45 and σ of 0.3. (First to fourth embodiments to be described hereinunder are according to a first mode of the invention.)

As lithographic process setting values, the defocus latitude was set to 2.0 μm (±1.00 μm), and the mask pattern size latitude was set to ±0.05 μm (on 5 times reticle). In case of transferring a 0.3 μm contact hole, five combinations of the half-light shielding area amplitude transmissivity and the mask pattern size (on 5 times reticle) were set as 25% and 1.50 μm, 30% and 1.60 μm, 35% and 1.75 μm, 40% and 1.85 μm, and 45% and 1.95 μm. With each of these different masks, the following was made.

In the first place, for each of these five masks the exposure dose was set such that a transfer contact hole of 0.3 μm could be obtained under the conditions of defocus of 0 μm and no mask pattern size deviation.

Then, the defocus was set to 0 μm, ±0.25 μm, ±0.50 μm, ±0.75 μm and ±1.00 μm. The mask pattern size deviation on the 5 times reticle was set to −0.05 μm, 0.00 μm and 0.05 μm. The deviation of the exposure dose from the setting value was set to −20%, −15%, −10%, −5%, 0%, 5%, 10%, 15% and 20%. The simulation parameters as noted above are desirably continuous values, but discrete values were provided by taking the calculation time into considerations. For all these combinations of parameter values, light intensity distributions were obtained by using a light intensity simulator based on the scalar diffraction theory.

Figure 1:
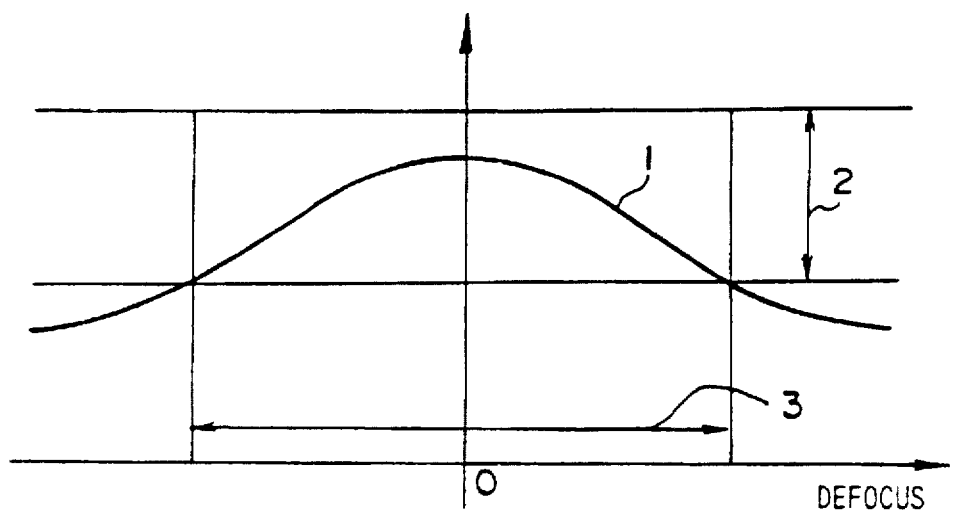
FIGS. 1 and 2 are views for describing a method of exposing in the prior art.
Figure 2:
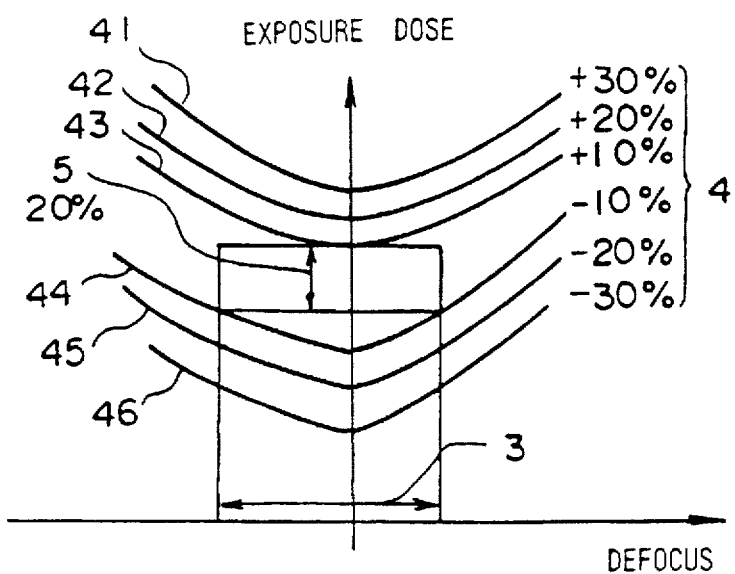
Figure 3:
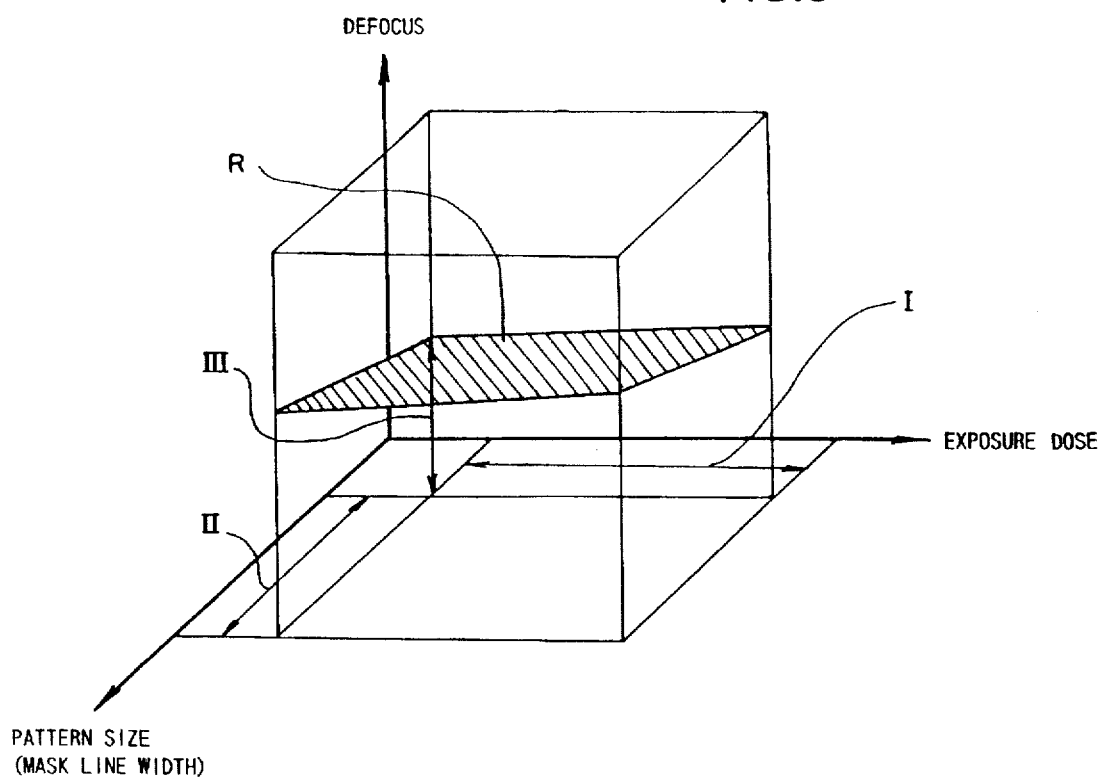
FIG. 3 is a view for describing the constitution of the invention.
Figure 4:
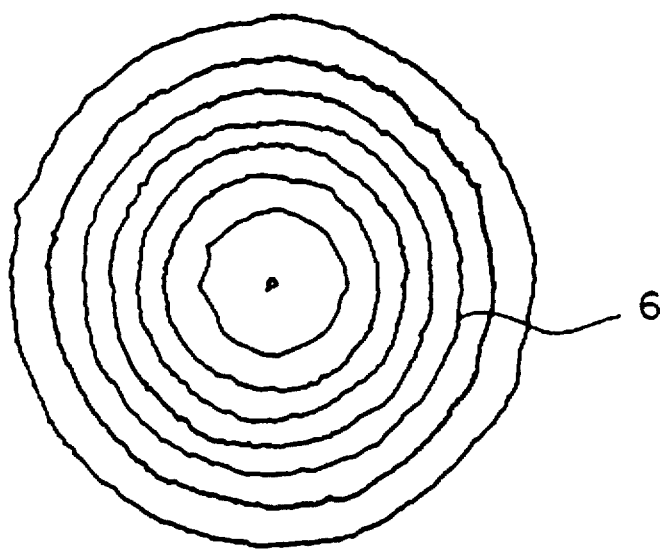
FIG. 4 is a contour line view corresponding to threshold providing transfer pattern size, as obtained from exposure dose and resist sensitivity, for describing embodiments of the invention.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity threshold values, were obtained and made to be transfer resist patterns.

As the diameter of the contour lines, the contact hole size in the resist patterns was obtained. Then, a check is made as to whether the size meets a predetermined contact hole size tolerance condition. The resist pattern size tolerance condition was set such that the deviation from a design mask pattern size of 0.3 µm was within 10%.

From the result of the check, the range of exposure dose, in which resist patterns obtained with all the combinations of the defocus and mask pattern size values meet a predetermined tolerance condition, was obtained and made to be the exposure dose latitude.

Among the five combinations of the half-light shielding area transmissivity and mask pattern size obtained in the above procedure, the greatest exposure dose latitude could be obtained with the amplitude transmissivity of the half-light shielding area transmissivity of 45% and the mask pattern size of 1.95 µm.

The mask obtained in this embodiment sufficiently met the depth of focus of 2.0 µm and the mask pattern size latitude of ±0.05 µm (on 5 times reticle). Further, it had sufficiently great exposure dose latitude to permit exposing with sufficient latitude, and it was possible to obtain a sharp resist pattern shape.

While in this embodiment the invention was applied to the attenuated phase-shifting mask, this is by no means limitative, similar effects are obtainable with masks of conventional systems and also with phase shift masks of other systems. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scaler diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes. Further, it is possible to obtain transfer resist patterns directly by transfer experiments.

Further, as for the defocus latitude, mask pattern size latitude and mask pattern size latitude, the values in this embodiment are by no means limitative, and it is possible to adopt other conditions as well.

A second embodiment of the invention will now be described.

This embodiment is an example of application of the invention to the optimization of the exposing condition of a half-tone system phase shift mask. In this embodiment, with exposure wavelength of 248 nm and NA of 0.45, judgment is made as to which of exposing conditions of σ of 0.3 and 0.5 is to be adopted.

As lithographic process setting values, the defocus latitude was set to 2.0 µm (±1.00 µm), and the mask pattern size latitude was set to ±0.05 µm (on 5 times reticle). Further, the amplitude transmissivity of the half-light shielding area of the half-tone system phase shift mask was set to 40%, and the mask pattern size (on 5 times reticle) when transferring a contact hole of 0.3 µm was set to 1.85 µm in case of σ of 0.3 and to 1.75 µm in case of σ of 0.5. Under these two different exposing conditions, the following was made.

In the first place, under each of the two exposing conditions the exposure dose was set such that a transfer contact hole of 0.3 µm could be obtained under the conditions of defocus of 0 µm and no mask pattern size deviation.

Then, the defocus was set to 0 µm, ±0.25 µm, ±0.50 µm, ±0.75 µm and ±1.00 µm. The mask pattern size deviation on the 5 times reticle was set to −0.05 µm, 0.00 µm and 0.05 µm. The deviation of the exposure dose from the setting value was set to −20%, −15%, −10%, −5%, 0%, 5%, 10%, 15% and 20%. The simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity threshold values, where obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.3 µm was within 10%.

From the result of this check, the range of exposure dose, in which resist patterns obtained with all the combinations of the defocus and mask pattern size values meet a predetermined tolerance condition, was obtained and made to be the exposure dose latitude.

Of the above two different values of σ set in the above procedure, the maximum exposure dose latitude could be obtained with σ=0.3. Thus, σ=0.3 was adopted.

The mask obtained in this embodiment sufficiently met the depth of focus of 2.0 µm and the mask pattern size latitude of ±0.05 m (on 5 times reticle). Further, it had sufficiently great exposure dose latitude to permit exposing with sufficient latitude, and it was possible to obtain a sharp resist pattern shape.

While in this embodiment the invention was applied to the half-tone system phase shift mask, this is by no means limitative, similar effects are obtainable with masks of conventional system and also with phase shift masks of other systems. Further, while this embodiment is concerned with contact hole patterns, this is only exemplary, and similar effects are obtainable with other patterns than the contact hole patterns.

Further, while transfer resist patterns were obtained by a process of obtaining the contour lines of the light intensity distribution obtained by the light intensity simulation based on the scaler diffraction theory, this is by no means limitative, and it is possible to use light intensity simulator based on the vector diffraction theory or other theories. Further, it is possible to obtain light intensity distribution by experiments. In obtaining transfer resist patterns from light intensity distribution, it is possible use development simulators or other calculation processes. Further, it is possible to obtain transfer resist patterns directly by transfer experiments.

Further, as for the defocus latitude, mask pattern size latitude and resist pattern size latitude, the values in this embodiment are by no means limitative, and it is possible to adopt other conditions as well.

A third embodiment of the invention will now be described.

This embodiment is an example of application of the invention to the optimization of the exposing condition for a photomask having a transmitting area and a light shielding area. In this embodiment, a judgment was made as to which one of four different exposing conditions is to be adopted, the conditions being such that σ of 0.3 and 0.5 with exposure wavelength of 248 nm and NA of 0.45 and σ of 0.3 and 0.5 with exposure wavelength of 365 nm and NA of 0.57.

As lithographic process setting values, the defocus latitude was set to 2.0 μm (±1.00 μm), and the mask pattern size latitude was set to ±0.05 μm (on 5 times reticle). In case of transferring a 0.5 μm contact hole, with the mask pattern size set to 2.5 μm (on 5 times reticle) the following was made under each of the four exposing conditions.

In the first place, under each of the four exposing conditions the exposure dose was set such that a transfer contact hole of 0.5 μm could be obtained under the conditions of defocus of 0 μm and no mask pattern size deviation.

Then, the defocus was set to 0 μm, ±0.25 μm and ±0.50 μm, ±0.75 μm and ±1.00 μm. The mask pattern size deviation on the 5 times reticle was set to −0.05 μm, 0.00 μm and 0.05 μm. The deviation of the exposure dose from the setting value was set to −20%, −15%, −10%, −5% %, 0%, 10%, 15% and 20%. The simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values, giving transfer pattern sizes were obtained from exposure dose in the exposing apparatus and empirically obtained resist sensitivity. Further, contour lines 6 as shown in FIG. 4, corresponding to the light intensity threshold values, were obtained and made to be transfer resist patterns.

As the diameter of the contour lines, the contact hole size in the resist patterns was obtained. Then, a check is made as to whether the size meets a predetermined contact hole size tolerance condition. The resist pattern size tolerance condition was set such that the deviation from a design mask pattern size of 0.5 μm was within 10%.

From the result of the check, the range of exposure dose, in which resist patterns obtained with all the combinations of the defocus and mask pattern size values meet a predetermined tolerance condition, was obtained and made to be exposure dose latitude.

Among the four exposing conditions obtained in the above procedure, the maximum light exposure latitude was obtained in the case of the exposure wavelength of 248 nm, NA of 0.45 and σ of 0.3. This condition was thus adopted.

The mask obtained in this embodiment sufficiently met the depth of focus of 2.0 μm and the mask pattern size latitude of ±0.5 μm (on 5 times reticle). Further, it has sufficiently great exposure dose latitude to permit exposing with sufficient latitude, and it was possible to obtain a sharp resist pattern shape.

While in this embodiment the invention was applied to a photomask having a transmitting area and a light shielding area, this is by no means limitative, and similar effects are obtainable with phase shift masks, etc. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer patterns from light intensity distributions, it is possible to use development simulators or other calculation processes. Further, it is possible to obtain transfer resist patterns directly by transfer experiments.

Further, as for the defocus latitude, mask pattern size latitude and resist pattern size latitude, the values in this embodiment are by no means limitative, and it is possible to adopt other conditions as well.

A fourth embodiment of the invention will now be described.

The embodiment is an example of application of the invention to a photomask having an exposing area and a transmitting area under the exposing conditions of exposing wavelength of 365 nm, NA of 0.57 and σ of 0.3.

As lithographic process setting values, the defocus latitude was set to 1.0 μm (±0.5 μm), and the mask pattern size latitude was set to ±0.5 μm (on 5 times reticle). In case of transferring a 0.5 μm contact hole, four different mask pattern sizes of 2.40 μm, 2.45 μm, 2.50 μm and 2.55 μm were set on 5 times reticle. With each of these mask pattern sizes, the following was made.

In the first place, for each of these four masks, the exposure dose was set such that a transfer contact hole of 0.5 μm could be obtained under the conditions of defocus of 0 μm and no mask pattern size deviation.

Then, the defocus was set to 0 μm, ±0.25 μm and ±0.5 μm. The mask pattern size deviation on the 5 times reticle was set to −0.05 μm, 0.00 μm and 0.05 μm. The deviation of the exposure dose from the setting value was set to −20%, −15%, −10%, −5%, 0%, 5%, 10%, 15% and 20%. The simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity threshold values, were obtained and made to be transfer patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.5 μm was within 10%.

From the result of the check, the range of exposure dose, in which resist patterns obtained with all the combinations of the defocus and mask pattern size values meet a predetermined tolerance condition, was obtained and made to be the exposure dose latitude.

Among the four patterns obtained by the above procedure, the maximum exposure latitude could be obtained with the mask pattern size of 2.40 μm. Thus, this condition was adopted.

The mask obtained in this embodiment sufficiently met the depth of focus of 1.0 μm and the mask pattern size latitude of ±0.05 μm (on 5 times reticle). It had sufficiently great exposure dose latitude to permit exposing with sufficient latitude, and it was possible to obtain a sharp resist pattern shape.

While in this embodiment the invention was applied to a photomask having a transmitting area and a light shielding area, this is by no means limitative, and similar effects are obtainable with phase shift masks or the like. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes.

Further, it is possible to obtain transfer resist patterns directly by transfer experiments.

Further, as for the defocus latitude, mask pattern size latitude and resist pattern size latitude, the values in this embodiment are by no means limitative, and it is possible to adopt other conditions as well.

A fifth embodiment of the invention will now be described.

This embodiment is an example of application of the invention to half-tone system phase shift mask under the exposing conditions of exposure wavelength of 246 nm, NA of 0.45 and σ of 0.3.

As lithographic process setting values, the exposure dose latitude was set to ±5%, and the mask pattern size latitude was set to ±0.05 μm (5 times reticle). For transferring a contact hole of 0.3 μm, five different combinations of the amplitude transmissivity of the half-light shielding area and mask pattern size (on 5 times reticle) were set as 25% and 1.50 μm, 30% and 1.60 μm, 35% and 1.75 μm, 40% and 1.85 μm, and 45% and 1.95 μm. With each of these five different masks, the following was made.

In the first place, for each of these five masks the exposure dose was set such that a transfer contact hole of 0.3 μm could be obtained under the conditions of defocus of 0 μm and no mask pattern size deviation.

Then, the deviation of the exposure dose from the setting value was set to −5%, 0% and 5%. The mask pattern size deviation on 5 times reticle was set to −0.05 μm, 0.00 μm, and 0.05 μm. Further, the defocus was set to 0 μm, ±0.25 m, ±0.50 μm, ±0.75 μm, ±1.00 μm, and ±1.25 μm. The simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity threshold values, were obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.3 μm was within 10%.

From the result of the check, the range of defocus, in which the resist patterns obtained with all the combinations of the exposure dose and mask pattern size values meet a predetermined tolerance condition, was obtained and made to be the defocus latitude.

Among the five combinations of the half-light shielding area transmissivity and mask pattern size obtained by the above procedure, the maximum defocus latitude could be obtained with the combination of the amplitude transmissivity of the half-light shielding area of 45% and the mask pattern size of 1.95 μm.

The mask obtained in this embodiment sufficiently met the exposure dose latitude of ±5% and the mask pattern size latitude of ±0.05 μm (on 5 times reticle). Further, it had sufficiently great defocus latitude to permit exposing with sufficient latitude, and it was possible to obtain a sharp resist pattern shape.

While in this embodiment the invention was applied to the half-tone the half-tone system phase shift mask, this is by no means limitative, and similar effects are obtainable with conventional system masks and other system phase shift masks. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes. Further, it is possible to obtain transfer resist patterns directly by transfer experiments.

Further, as for the exposure dose latitude, defocus latitude and mask pattern size latitude, the values in this embodiment are by no means limitative, and it is possible to adopt other conditions as well.

A sixth embodiment of the invention will now be described.

This embodiment is an example of application of the invention to optimization of the exposing condition of a half-tone system shift mask. In this embodiment, with exposure wavelength of 248 nm and NA of 0.45, a judgment was made as to which one of the exposing conditions of σ of 0.3 and 0.5 is to be adopted.

As lithographic process setting values, the exposure dose latitude was set to ±5%, and the mask pattern size latitude was set to ±0.05 μm (5 times reticle). Further, the amplitude transmissivity of the half-tone system phase shift mask was set to 40%, and the mask pattern size (on 5 times reticle) when transferring a contact hole of 0.3 μm was set to 1.85 μm in case of σ of 0.3 and 1.75 μm in case of σ of 0.5. Under each of these two exposing conditions, the following was made.

In the first place, under each of the two exposing conditions the exposure dose was set such that a transfer contact hole of 0.3 μm could be obtained under the conditions of defocus of 0 μm and no mask pattern size deviation.

Then, the deviation of the exposure dose from the setting value was set to –5%, 0% and 5%. The mask pattern size deviation on 5 time reticle was set to –0.05 μm, 0.00 μm, and 0.05 μm. Further, the defocus was set to 0 μm ±0.25 μm, ±0.50 μm ±0.75 m ±1 00 μm and 1.25 μm. The simulation parameters as noted above are ± desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity threshold values, were obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set set such that the deviation from a design mask pattern size of 0.3 was within From the result of the check, the range of defocus, in which resist patterns obtained with all the combinations of the exposure dose and mask pattern size values meet a predetermined tolerance condition, was obtained and made to be the defocus latitude.

Of the two values of σ obtained by the above procedure, the maximum defocus latitude could be obtained with σ=0.3. Thus, σ=0.3 was adopted.

The mask obtained in this embodiment sufficiently met the exposure dose latitude of ±5% and the mask pattern size latitude of ±0.05 μm (on 5 times reticle). Further, it has sufficiently great defocus latitude to permit exposing with sufficient latitude, and it was possible to obtain a sharp resist pattern shape.

While in this embodiment the invention was applied to the half-tone system phase shift mask, this is by no means limitative, and similar effects are obtainable with masks of conventional systems and also with phase shift masks of other systems. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes. Further, it is possible to obtain transfer resist patterns directly by transfer experiments.

Further, as for the exposure dose latitude, mask pattern size latitude and resist pattern size latitude, the values in this embodiment are by no means limitative, and it is possible to adopt other conditions as well.

A seventh embodiment of the invention will now be described.

This embodiment is an example of application of the invention to optimization of the exposing conditions of a photomask having a transmitting area and a light shielding area. In this embodiment, a judgment was made as to which one of four different exposing conditions, namely those in which σ is 0.3 and 0.5 with exposure wavelength of 248 nm and NA of 0.45 and those in which σ is 0.3 and 0.5 with exposure wavelength of 365 nm and NA of 0.57, is to be adopted.

As lithographic process setting values, the exposure dose latitude was set to ±5%, and the mask pattern size latitude was set to ±0.05 μm (on 5 times reticle). Further, the mask pattern size when transferring a contact hole of 0.5 μm was set to 2.5 μm (on 5 times reticle)L. Under each of these four exposing conditions, the following was made.

In the first place, under each of the four exposing conditions, the exposure dose was set such that a transfer contact hole of 0.5 μm could be obtained under the conditions of defocus of 0 μm and no mask pattern size deviation.

Then, the deviation of the exposure dose from the setting value was set to –5%, 0% and 5%, and the deviation of the mask pattern size on the 5 times reticle was set to –0.05 μm, 0.00 μm, and 0.05 μm. The defocus was set to 0 μm, ±0.25 μm, ±0.50 μm, ±0.75 μm, ±1.00 μm, and ±1.25 μm. The simulation parameters as noted above are desirably continuous values, but discrete values were provided by taking the calculation time into considerations. For all these combinations of parameter value, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity threshold old values, were obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.5 μm was within 10%.

From the result of the check, the range of defocus, in which resist patterns obtained in all the combinations of the exposure dose and mask pattern size values meet a predetermined tolerance condition, was obtained and made to be the defocus latitude.

Among the four exposing conditions obtained in the above procedure, the maximum defocus latitude could be obtained in the case with exposure wavelength of 248 nm, NA of 0.45 and σ of 0.3. This condition was adopted.

The mask obtained in this embodiment sufficiently met the exposure dose latitude of ±5% and mask pattern size latitude of ±0.05 μm (on 5 times reticle). Further, it had sufficiently great defocus latitude to permit exposing with sufficient latitude, and it was possible to obtain a sharp resist pattern shape.

While in this embodiment the invention was applied to the photomask having a transmitting area and a light shielding area, this is by no means limitative, and similar effects are obtainable with phase shit masks and the like as well. Further, while this embodiment concerned with contact hole patterns, this is only exemplary, and similar effects are obtainable with other patterns than the contact hole patterns.

Further, while the transfer patterns were obtained by the process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes. Further, it is possible to obtain transfer resist patterns directly by transfer experiments.

Further, as for the exposure dose latitude, mask pattern size latitude and resist pattern size latitude, the values in this embodiment are by no means limitative, and it is possible to adopt other conditions as well.

An eighth embodiment of the invention will now be described.

This embodiment is an example of application of the invention to a photomask having a transmitting area and a light shielding area under exposing conditions of exposure wavelength of 365 nm, NA of 0.57 and σ of 0.3.

As lithographic process setting values, the exposure dose latitude was set to ±5%, and the mask pattern size latitude was set to ±0.05 μm (5 times reticle). In addition, the mask pattern size on 5 times reticle when transferring 0.5 μm contact hole was set to 2.40 μm, 2.45 μm, 2.50 m and 2.55 μm. With these four different patterns, the following was made.

In the first place, for each of the four masks the exposure dose was set such that a transfer contact hole of 0.3 μm could be obtained under the conditions of defocus of 0 μm and no pattern size deviation.

Then, the deviation of the exposure dose from the setting value was set to −5%, 0% and 5%, and the deviation of the mask pattern size on the 5 times reticle was set to −0.05 m, 0.00 μm and 0.05 μm. The defocus was set to 0 μm, ±0.25 m, ±0.50 μm, ±0.75 μm, ±1.00 μm, and 1.25 μm. The simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in exposing apparatus and empirically obtained resist sensitivity. Further, contour lines 6 as shown in FIG. 4, corresponding to the light intensity threshold values, where obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that deviation from a design mask pattern size of 0.5 μm was within 10%.

From the result of the check, the range of defocus, in which resist patterns obtained with all the combinations of the exposure dose and mask pattern size values meet a predetermined tolerance condition, was obtained and made to be the defocus latitude.

Among the four different pattern sizes obtained in the above procedure, the maximum defocus latitude could be obtained with the mask pattern size of 2.40 μm. This condition was adopted.

The mask obtained in this embodiment sufficiently met the exposure dose latitude of ±5% and the mask pattern side latitude of ±0.05 μm (5 times reticle). Further, it had sufficiently great defocus latitude, and it was possible to obtain a sharp resist pattern shape.

While in this embodiment the invention was applied to the photomask having a transmitting area and a light shielding area, this is by no means limitative, and similar effects are obtainable with phase shift masks and the like as well. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes. Further, it is possible to obtain transfer resist patterns directly by transfer experiments.

Further, as for the exposure dose latitude, mask pattern size latitude and resist pattern latitude, the values in this embodiment are by no means limitative, and it is possible to adopt other conditions as well.

A ninth embodiment of the invention will now be described.

This embodiment is an example of application of the invention to a half-tone system phase shift mask under exposing conditions of exposure wavelength of 248 nm, NA of 0.45 and σ of 0.3.

As lithographic process setting values, the defocus latitude was set to 2.0 μm (±1.00 μm), and the exposure dose latitude of ±5%. When transferring a contact hole of 0.3 μm, five combinations of the amplitude transmissivity of the half-light shielding area and mask pattern size (on 5 times reticle) are set as 25% and 1.50 μm, 30% and 1.60 μm, 35% and 1.75 μm, 40% and 1.85 μm, and 45% and 1.95 μm. With each of these five different masks, the following was made.

In the first place, for each of these five masks the exposure dose was set such that a transfer contact hole of 0.3 μm could be obtained under the conditions of defocus of 0 μm and no mask pattern size deviation.

Then, the defocus was set to 0 μm, ±0.25 μm, ±0.50 μm, ±0.7 μm, ±1.00 μm, and the deviation of the exposure dose from the setting value was set to −5%, 0% and 5%. The deviation of the mask pattern size on the 5 times reticle was set to −0.20 μm, −0.15 μm, −0.10 m, −0.05 μm, 0.00 μm, 0.05 μm, 0.10 μm, 0.15 μm, and 0.20 μm. The simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity values, were obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.3 μm was within 10%.

From the result of the check, the range of mask pattern size, in which resist patterns obtained with all the combinations of the defocus and exposure dose values meet a predetermined tolerance condition, was obtained and made to be the exposure dose latitude.

Among the five combinations of the half-light shielding area transmissivity and mask pattern size obtained by the above procedure, the maximum mask pattern size latitude could be obtained with the combination of the amplitude transmissivity of the half-light shielding area transmissivity of 45% and the mask pattern size of 1.95 μm.

The mask obtained in this embodiment sufficiently met the defocus latitude of 2.0 μm and the exposure latitude of ±5%. Further, it had sufficiently great mask pattern size latitude to permit exposing with sufficient latitude, and it was possible to obtain a sharp resist pattern shape.

While in this embodiment the invention was applied to the half-tone system phase shift mask, this is by no means limitative, and similar effects are obtainable with masks of conventional systems and also with phase shift masks other system. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes. Further, it is possible to obtain transfer resist patterns directly by transfer experiments.

Further, as for the exposure dose latitude, defocus latitude and mask pattern size latitude, the values in this embodiment are by no means limitative, and it is possible to adopt other conditions as well.

A tenth embodiment of the invention will now be described.

This embodiment is an example of application of the invention to optimizing the exposing conditions of a half-tone tone system phase shift mask. In this embodiment, a judgment was made as to which one of two exposing conditions, namely with σ of 0.3 and 0.5, with exposure wavelength of 248 nm and NA of 0.45, is to be adopted.

As lithographic process setting values, the defocus latitude was set to 2.0 μm (±1.00 μm), and the exposure dose latitude was set to ±5%. Further, the amplitude transmissivity of the half-light shielding area of the half-tone system phase shift mask was set to 40%, and the mask pattern size (on 5 times reticle) when transferring a contact hole of 0.3 μm, was set to 1.85 μm for σ of 0.3 and 1.75 μm for σ of 0.5. Under each of these two exposing conditions, the following was made.

In the first place, for each mask the exposure dose was set such that a transfer contact hole of 0.3 m could be obtained under the conditions of defocus of 0 μm and no mask pattern size deviation.

Then, as simulation parameters, the defocus was set to 0 μm, ±0.25 μm, ±0.50 μm, ±0.75 μm, and ±1.00 μm, and the deviation of the exposure dose from the setting value was set to −5%, 0% and 5%. Further, the deviation of the mask pattern size on the 5 times reticle was set to −0.20 μm, −0.15 μm, 31 0.10 μm, −0.05 μm, 0.00 μm, 0.05 μm, 0.10 μm, 0.15 μm, and 0.20 μm. The simulation parameters as noted above are desirably continuous values, but discrete values were provided by taking the calculation time into consideration. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity threshold values, were obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.3 was within 10%.

From the result of the check, the range of mask pattern size, in which resist patterns obtained with all the combinations of the defocus and mask pattern size values meet a predetermined tolerance condition, was obtained and made to be the mask pattern size latitude.

Of the two values of σ obtained in the above procedure, the maximum mask pattern size latitude could be obtained with σ=0.3. Thus, σ=0.3 was adopted.

The mask obtained in this embodiment sufficiently met the defocus latitude of 2.0 μm and the exposure dose latitude of ±5%. Further, it had sufficient mask pattern size latitude to permit exposing with sufficient latitude, and it was possible to obtain a sharp resist pattern shape.

With the exposing conditions and masks as determined in the above, it was possible to sufficiently meet the defocus latitude of 2.0 μm and the exposure dose latitude of ±10% and obtain a sharp resist pattern shape. In consequence, it was possible to manufacture semiconductor devices with satisfactory yield.

While in this embodiment the invention was applied to the half-tone system phase shift mask, this is by no means limitative, and similar effects are obtainable with masks of conventional systems and also with phase shift masks of other systems. Further, while this embodiment is concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes. Further, it is possible to obtain transfer resist patterns directly by transfer experiments.

Further, as for the exposure dose latitude, the defocus latitude and the mask pattern size latitude, the values in this embodiment are by no means limitative, and it is possible to adopt other conditions as well.

An eleventh embodiment of the invention will now be described.

This embodiment is an example of application of the invention to optimizing the exposing conditions of a usual photomask having a transmitting area and a light shielding area. In this embodiment, a judgment was made as to which one of four different exposing conditions, namely those with σ of 0.3 and 0.5 with exposure wavelength of 248 nm and NA of 0.45 and those with of 0.3 and 0.5 with exposure wavelength of 365 nm and NA of 0.57, is to be adopted.

As lithographic process setting values, the defocus latitude was set to 2.0 μm, and the exposure dose latitude was set to ±5%. Further, the mask pattern size (on 5 times reticle) when transferring a contact hole of 0.5 μm was set to 2.5 μm. Under these four exposing conditions, the following was made.

In the first place, for each mask the exposure dose was set such that a transfer contact hole of 0.5 μm could be obtained under the conditions of defocus of 0 μm and no mask pattern size deviation.

Then, as simulation parameters the defocus was set to 0 μm, ±0.25 μm, 0.50 μm, ±0.75 μm, and +1.00 m, and the deviation of the exposure dose from the setting value was set to -5%, 0% and 5%. The deviation of the mask pattern size on the 5 times reticle was set to -0.20 μm, -0.15 μm, -0.10 μm, -0.05 μm, 0.00 μm, 0.05 μm, 0.10 μm, 0.15 μm, and 0.20 μm. These simulation parameters are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity threshold values, were obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.5 μm was within 10%.

From the result of the check, the range of mask pattern size, in which resist patterns obtained with all the combinations of the defocus and mask pattern size values meet a predetermined tolerance condition, was obtained and made to be the mask pattern size latitude.

Among the four exposing conditions obtained in the above procedure, the maximum mask pattern size latitude could be obtained in the case with exposure wavelength of 248 nm, NA of 0.45 and σ of 0.3. This condition was thus adopted.

The mask obtained in this embodiment sufficiently met the defocus latitude of 2.0 μm and the exposure dose latitude of ±5%. Further, it had sufficiently great mask pattern size latitude, and it was possible to obtain a sharp resist pattern shape.

With the exposing conditions and masks as determined in the above, it was possible to sufficiently meet the defocus latitude of 2.0 μm and the exposure dose latitude of ±10% and obtain a sharp resist pattern shape. In consequence, it was possible to manufacture semiconductor devices with satisfactory yield.

While in this embodiment the invention was applied to the usual photomask having a transmitting area and a light shielding area, this is by no means limitative, and similar effects are obtainable with phase shift masks and the like as well. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulator or other calculation processes. Further, it is possible to obtain transfer resist patterns directly by transfer experiments.

Further, as for the exposure dose latitude, the defocus latitude and the mask pattern size latitude, the values in this embodiment are by no means limitative, and it is possible to adopt other conditions as well.

A twelfth embodiment of the invention will now be described.

This embodiment is an example of application of the invention to a photomask having a transmitting area and a light shielding area under the exposing conditions of exposure wavelength of 365 nm, NA of 0.57 and σ of 0.3.

As lithographic process setting values, the defocus latitude was set to 1.0 μm (±0.5 μm), and the exposure dose latitude was set to ±5%. Further, the mask pattern size on 5 times reticle for transferring a contact hole of 0.5 μm was set to 2.40 μm, 2.45 μm, 2.50 μm, and 2.55 μm. With each of these four patterns, the following was made.

In the first place, for each of the four masks the exposure dose was set such that a transfer contact hole of ±0.5 μm could be obtained under the conditions of defocus of 0 μm and no mask pattern size deviation.

Then, the defocus was set to 0 μm, ±0.25 μm, and -0.50 μm, and the deviation of the exposure dose from the setting value was set to -5%, 0% and 5%. Further, the deviation of the mask pattern size on the 5 times reticle was set to -0.20 μm, -0.15 μm, -0.10 μm, -0.05 μm, 0.00 μm, 0.05 μm, 0.10 μm, 0.15 μm, and 0.20 μm. The simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines 6 as shown in FIG. 4, corresponding to the light intensity threshold values, were obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.5 μm was within 10%.

From the result of the check, the range of mask pattern size, in which resist patterns obtained with all the combinations of the defocus and mask pattern size values meet a predetermined condition, was obtained and made to be the mask pattern size latitude.

Of the four patterns obtained in the above procedure, the maximum mask pattern size latitude could be obtained with the mask pattern size of 2.40 μm. Thus, this condition was adopted.

The mask obtained in this embodiment sufficiently met the depth of focus of 1.0 μm and the exposure dose latitude of ±5%. Further, it had sufficient exposure pattern latitude to permit exposing with sufficient latitude, and it was possible to obtain a sharp resist pattern shape.

While in this embodiment the invention was applied to the photomask having a transmitting area and a light shielding area, this is by no means limitative, and similar effects are obtainable with phase shift masks and the like as well. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes. Further, it is possible to obtain transfer resist patterns directly by transfer experiments.

Further, as for the exposure dose latitude, the defocus latitude and the mask pattern size latitude, the values in this embodiment are by no means limitative, and it is possible to adopt other conditions as well.

A thirteenth embodiment of the invention will now be described.

This embodiment is an example of application of the invention to optimizing the exposing condition of a photomask which has a usual light shielding area for substantially perfectly shielding light and a transmitting area. In this embodiment, in flex exposing with exposure wavelength of 365 nm, NA of 0.57, σ of 0.6 and number of light emission times of 2, a judgment was made as to which one of two different exposing conditions with focal point pitch of 1.5 μm and 2.0 μm is to be adopted.

As lithographic process setting values, the defocus latitude was set to 2.0 μm (±1.00 μm), and the mask pattern size latitude was set to ±0.05 μm (on 5 times reticle). Further, the mask pattern size when transferring a contact hole of 0.5 μm was set to 0.5 μm. Under each of these two exposing conditions, the following was made.

In the first place, under each of the two exposing conditions the exposure dose was set such that a transfer contact hole of 0.5 μm could be obtained under the conditions of defocus of 0 μm and no mask pattern size condition.

Then, the defocus was set to 0 μm, ±0.25 m, 0.50 μm, ±0.75 μm, and ±1.00 μm, and the deviation of the mask pattern size on the 5 times reticle was set to −0.05 μm, 0.00 μm, and 0.05 μm. Further, the deviation of the exposure dose from the setting value was set to −20%, −15 % −10%, −5%, 0%, 5%, 10%, 15%, and 20%. The simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines corresponding to the light intensity threshold values were obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.5 μm was within 10%.

With these values of the defocus, mask pattern size and resist pattern size, the range of exposure dose in the predetermined tolerance condition range, i.e., the exposure dose latitude, could be obtained.

Of the two exposing conditions obtained in the above procedure, the maximum exposure dose latitude could be obtained with the focal point pitch of 1.5 μm.

The method of exposing in this embodiment sufficiently met the depth of focus of 2.0 μm and the mask pattern size latitude of ±0.05 μm (on 5 times reticle). Further, because of sufficiently great exposure dose latitude, it was possible to obtain exposing with sufficient latitude, and it was possible to obtain a sharp resist pattern shape.

While in this embodiment the invention was applied to the photomask having a usual light shielding area and a transmitting area, this is by no means limitative, and similar effects are obtainable with shift masks and the like as well. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to use development simulators or other calculation processes. Further, it is possible to obtain transfer resist patterns directly by transfer experiments.

Further, as for the defocus latitude and the mask pattern size and resist pattern size tolerance conditions, the values in this embodiment are by no means limitative, and it is possible to adopt other conditions as well.

A fourteenth embodiment of the invention will now be described.

This embodiment is an example of application of the invention to optimizing the exposing condition with respect to a photomask having a usual light shielding area substantially perfectly shielding light and a transmitting area. In this embodiment, in flex exposing with exposure wavelength of 365 nm, NA of 0.57, σ of 0.6 and number of exposing times of 2, a judgment was made as to which one of two different exposing conditions, i.e., focal point pitches of 1.5 μm and 2.0 μm, is to be adopted.

As lithographic process setting values, the exposure dose latitude was set to ±5%, and the mask pattern size latitude was set to ±0.05 μm (on 5 times reticle). Further, the mask pattern size when transferring a contact hole of 0.5 µm, was set to 0.5 µm. Under each of these two exposing conditions, the following was made.

In the first place, under each of the two exposing conditions, the exposure dose was set such that a transfer contact hole of 0.5 µm could be obtained under the conditions of defocus of 0 µm and no mask pattern size deviation.

Then, the deviation of the exposure dose from the setting value was set to −5%, 0% and 5%. The deviation of the mask pattern size on the 5 times reticle was set to −0.05 µm, 0.00 µm, and 0.05 µm. The defocus was set to 0 µm, ±0.25 µm, ±0.50 µm, ±0.75 µm, ±1.00 m, and ±1.25 m. The simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines corresponding to the light intensity threshold values were obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.5 µm was within 10%.

With these exposure doses, mask pattern size and resist pattern size values, the range of defocus in the predetermined tolerance condition ranges, that is, the defocus latitude, could be obtained.

Of the two exposing conditions obtained in the above procedure, the maximum defocus latitude could be obtained with the focal point pitch of 2.0 µm. This condition was thus adopted.

The method of exposing in this embodiment sufficiently met the exposure dose latitude of ±5% and the mask pattern size latitude of ±0.05 µm (on the 5 times reticle). Further, because of sufficiently great defocus latitude, it was possible to obtain exposing with sufficient latitude and also obtain a sharp resist pattern shape.

While in this embodiment the invention was applied to the photomask having a usual light shielding area and a transmitting area, this is by no means limitative, and similar effects are obtainable with phase shift masks and the like as well. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain light intensity distributions by experiments. In obtaining transfer resist patterns from light intensity distributions, it is possible to to use development simulators or other calculation processes. Further, it is possible to obtain transfer resist patterns directly by transfer experiments.

As for the exposure dose latitude, and the mask pattern size and resist pattern size tolerance conditions, the values in this embodiment are by no means limitative, and it is possible to adopt other conditions as well.

A fifteenth embodiment of the invention will now be described.

This embodiment is an example of application of the invention to optimizing the exposing condition with respect to a photomask having a usual light shielding area substantially perfectly shielding light and a transmitting area. In this embodiment, in flex exposing with exposure wavelength of 365 nm, NA of 0.57, σ of 0.6 and number of exposing times of 2, a judgment was made as to which one of two exposing conditions, i.e., focal point pitches of 1.5 µm and 2.0 µm, is to be adopted.

As lithographic process setting values, the defocus latitude was set to 2.0 m (±1.00 µm), and the mask pattern size latitude was set to ±0.05 µm (on 5 times reticle). Further, the mask pattern size when transferring a contact hole of 0.5 µm was set to 0.5 µm. Under each of these two exposing conditions, the following was made.

In the first place, under each of these exposing conditions, the exposure dose was set such that a transfer contact hole of 0.5 µm could be obtained under the conditions of defocus of 0 µm and no mask pattern size deviation.

Then, the deviation of the exposure dose from the setting value was set to −5%, 0, % and 5%, and the defocus was set to 0 µm, ±0.25 µm, ±0.50 µm, ±0.75 µm, and ±1.00 µm. The deviation of the mask pattern size on the 5 times reticle was set to −0.2 µm, −0.15 µm, −0.10 µm, −0.05 µm, 0.00 µm, 0.05 µm, 0.10 µm, 0.15 µm, and 0.20 µm. These simulation parameters as noted above are desirably continuous values, but discrete values were provided by taking the calculation time into considerations. For all these combinations of parameter values, light intensity distributions were obtained by using a light intensity simulator based on the scalar diffraction theory.

With these light intensity distributions, light intensity threshold values giving transfer pattern sizes were obtained from exposure dose in the exposing apparatus and empirically obtained resist sensitivity. Further, contour lines corresponding to the light intensity threshold values are obtained and made to be transfer resist patterns.

As the diameter of the contour lines, the contact hole size in the resist patterns was obtained. Then, a check was made as to whether the size meets a predetermined contact hole size tolerance condition. The resist pattern size tolerance condition was set such that the deviation from a design mask pattern size of 0.5 µm was within 10%.

With these defocus, exposure dose and resist pattern size values, the range of mask pattern size in predetermined tolerance condition ranges, i.e., the mask pattern size latitude, could be obtained.

Of the two exposing conditions obtained in the above procedure, the maximum mask pattern size latitude could be obtained with the focal point pitch of 1.5 µm. This condition was thus adopted.

The method of exposing in this embodiment sufficiently met the defocus latitude of 1.5 µm and the exposure dose latitude of ±5%. Further, it permitted mask production with sufficient mask pattern size latitude, and it also permitted a sharp resist pattern shape to be obtained. Thus, it was possible to manufacture semiconductor devices with satisfactory yield.

While in this embodiment the invention was applied to the photomask having a usual light shielding area and a transmitting area, this is by no means limitative, and similar effects are obtainable with phase shift masks and the like as well. Further, while this embodiment concerned with contact hole patterns, this is only exemplary, and similar effects are obtainable with other patterns than the contact hole patterns.

Further, while the transfer resist patterns were obtained by a process of obtaining the contour lines of the light intensity distributions obtained by the light intensity simulation based on the scalar diffraction theory, this is by no means limitative, and it is possible to use light intensity simulator based on the vector diffraction theory or other theories. Further, it is possible to obtain Light intensity distributions by experiments. In obtaining transfer resist patterns from light intensity distributions, it is possible to use development simulators or other calculation processes. Further, it is possible to obtain transfer resist patterns directly by transfer experiments.

Further, as for the exposure dose latitude, defocus latitude and resist pattern size tolerance condition, the values in this embodiment are by no means limitative, and it is possible to adopt other conditions as well.

As has been described in the foregoing, according to the invention it is possible to provide a photomask, a method of producing the same, a method of exposing using the same and a method of manufacturing a semiconductor device using the same, which permit finding out correlations of many parameters, for instance three or more parameters, to one another, permit obtaining the optimum condition from these correlations, permit the aloofness from the actual condition to be reduced, permit quantitative grasping of various kinds of performance, permit influence of mask pattern size fluctuations, etc. into considerations, and permit actual optimization.

For example, by utilizing the invention it is possible specifically to obtain quantitative evaluation of parameters in the exposing process and those in the mask manufacture in consideration of the actual process. Particularly, by selecting the exposure dose latitude, defocus and mask pattern size as parameters and accurately evaluating the correlation of these parameters to one another in various exposing conditions, it is possible to manufacture semiconductor devices with satisfactory yield or build processes of manufacture with high efficiency and at low cost.

What is claimed is:

1. A photomask used for the photolithographic process and having a transmitting area and a light shielding area, said photomask being obtained by setting combinations of pluralities of defocus and mask pattern size values in predetermined ranges of the defocus latitude and the mask pattern size latitude, obtaining transfer patterns by varying the exposure dose, and checking whether the transfer patterns meet a design tolerance condition, thereby obtaining the exposure dose latitude as the range of exposure dose meeting the tolerance condition in all the predetermined ranges of the defocus latitude and the mask pattern size latitude.

a mask parameter being set for maximizing the mask pattern size latitude, the maximized mask pattern size latitude thereby maximizing the obtained exposure dose latitude, said mask parameter is one member or a combination of two or more members of the group consisting of the mask pattern size, the phase of the transmitting area, the transmissivity of the light shielding area and the phase of the light shielding area.

2. The photomask according to claim 1, wherein said transmitting area has two portions for transmitting light at mutually different phases.

3. The photomask according to claim 1, wherein said light shielding area transmits light in such an extent as not to sensitize a resist exposed in the photolithographic process and transmits light at a different phase from that of said transmitting area.

4. A method of producing a photomask having a transmitting area and a light shielding area comprising the steps of:

setting combinations of pluralities of defocus and mask pattern size values in predetermined ranges of the defocus latitude and the mask pattern size latitude, obtaining transfer patterns by varying the exposure dose, and checking whether the transfer patterns meet a design tolerance condition, thereby obtaining the exposure dose redundancy as the range of exposure dose meeting the tolerance condition in all the predetermined ranges of the defocus latitude and the mask pattern size latitude.

a mask parameter being set for maximizing the mask pattern size latitude, the maximized mask pattern size latitude thereby maximizing the obtained exposure dose latitude, said mask parameter is one member or a combination of two or more members of the group consisting of the mask pattern size, the phase of the transmitting area, the transmissivity of the light shielding area and the phase of the light shielding area.

5. A photomask having a transmitting area and a light shielding area, said photomask being obtained by setting combinations of pluralities of exposure dose and mask pattern size values in predetermined ranges of the exposure dose latitude and the mask pattern size latitude, obtaining transfer patterns by varying the defocus in the neighborhood of the just focus, and checking whether the transfer patterns meet a design tolerance condition, thereby obtaining the defocus latitude as the range of defocus meeting the tolerance condition in all the predetermined ranges of the exposure dose latitude and the mask pattern size latitude.

a mask parameter being set for maximizing the mask pattern size latitude, the maximized mask pattern size latitude thereby maximizing the obtained defocus latitude, said mask parameter is one member or a combination of two or more members of the group consisting of the mask pattern size, the phase of transmitting area, the transmissivity of the light shielding area and the phase of the light shielding area.

6. The photomask according to claim 5, wherein said transmitting area has two portions for transmitting light at mutually different phases.

7. The photomask according to claim 5, wherein said light shielding area transmits light in such an extent as not to sensitize a resist in the photolithographic process and transmits light at a different phase from that of said transmitting area.

8. A method of producing a photomask having a transmitting area and a light shielding area comprising the steps of:

setting combinations of pluralities of exposure dose and mask pattern size values in predetermined ranges of the exposure dose latitude and the mask pattern size latitude, obtaining transfer patterns by varying the defocus in the neighborhood of the just focus, and checking whether the transfer patterns meet a design tolerance condition, thereby obtaining the defocus latitude as the range of defocus meeting the tolerance condition in all the predetermined ranges of the exposure dose latitude and the mask pattern size latitude, a mask parameter being set for maximizing the mask pattern size latitude, the maximized mask pattern size latitude thereby maximizing the obtained exposure dose latitude, said mask parameter is one member or a combination of two or more members of the group consisting of the mask pattern size, the phase of the transmitting area, the transmissivity of the light shielding area and the phase of the light shielding area.

9. A photomask having a transmitting area and a light shielding area, said photomask being obtained by setting combinations of pluralities of exposure dose and defocus values in predetermined ranges of the exposure dose latitude and the defocus latitude, obtaining transfer patterns by varying the mask pattern size, and checking whether the transfer patterns meet a design tolerance condition, thereby obtaining the mask pattern size latitude as the range of mask pattern size meeting tolerance condition in all the predetermined ranges of the exposure dose latitude and the defocus latitude, a mask parameter being set for maximizing the mask pattern size latitude, said mask parameter is one member or a combination of two or more members of the group consisting of the mask pattern size, the phase of the transmitting area, the transmissivity of the light shielding area and the phase of the light shielding area.

10. The photomask according to claim 9, wherein said transmitting area has two portions for transmitting light at mutually different phases.

11. The photomask according to claim 9, wherein said light shielding area transmits light in such an extent as not to sensitize a resist exposed in the photolithographic process and transmits light at a different phase from that of said transmitting area.

12. A method of producing a photomask having a transmitting area and a light shielding area, said method comprising the steps of:

setting combinations of pluralities of exposure dose and defocus values in predetermined ranges of the exposure dose latitude and the defocus latitude;

obtaining transfer patterns by varying the mask pattern size latitude; and checking whether the transfer patterns meet a design tolerance condition, thereby obtaining the mask pattern size latitude as the range of mask pattern size meeting the tolerance condition in all the predetermined ranges of the exposure dose latitude and the defocus latitude;

a mask parameter being set for maximizing the mask pattern size latitude, said mask parameter is one member or a combination of two or more members of the group consisting of the mask pattern size, the phase of the transmitting area, the transmissivity of the light shielding area and the phase of the light shielding area.

* * * * *